(12) United States Patent
Kenington

(10) Patent No.: US 8,355,682 B2
(45) Date of Patent: Jan. 15, 2013

(54) RADIO TRANSMITTER AND METHOD FOR TRANSMISSION OF COMBINED SIGNAL

(75) Inventor: Peter Kenington, Chepstow (GB)

(73) Assignee: Ubidyne, Inc., Wilmington, DE (US)

( * ) Notice: Subject to any disclaimer, the term of this patent is extended or adjusted under 35 U.S.C. 154(b) by 157 days.

(21) Appl. No.: 12/898,021

(22) Filed: Oct. 5, 2010

(65) Prior Publication Data
US 2012/0083229 A1 Apr. 5, 2012

(51) Int. Cl.
*H04B 1/04* (2006.01)

(52) U.S. Cl. ........... 455/114.3; 455/114.1; 455/114.2; 455/91; 455/63.1; 455/126; 375/296; 375/297; 330/149

(58) Field of Classification Search ........... 455/114.3, 455/91, 63, 0.1, 126, 114.1, 114.2; 375/296, 375/297; 330/149
See application file for complete search history.

(56) References Cited

U.S. PATENT DOCUMENTS

| 7,183,847 B2 * | 2/2007 | Suzuki et al. | 330/149 |
| 2004/0264597 A1 * | 12/2004 | Vella-Coleiro | 375/297 |

* cited by examiner

*Primary Examiner* — Sanh Phu
(74) *Attorney, Agent, or Firm* — Stephen H. Eland; Dann, Dorfman, Herrell & Skillman

(57) ABSTRACT

A radio transmitter is disclosed which comprises at least two transmit paths. A combiner is connected to the at least two transmit paths for combining modified transmit signals on the at least two transmit paths to form a combined signal. The radio transmitter further comprises a; power amplifier for receiving and power amplifying the combined signal resulting in an amplified combined signal, at least one feedback path for sampling the amplified combined signal and at least two predistortion elements connected to the at least one feedback path and adapted to produce at least two individual predistortion functions for modification of the transmit signals in the at least two frequency bands to produce the modified transmit signals on the at least two transmit paths, resulting in a corrected amplified combined signal. A method for the transmission of a combined signal, wherein the combined signal comprises signals from different frequency bands, is also disclosed.

9 Claims, 4 Drawing Sheets

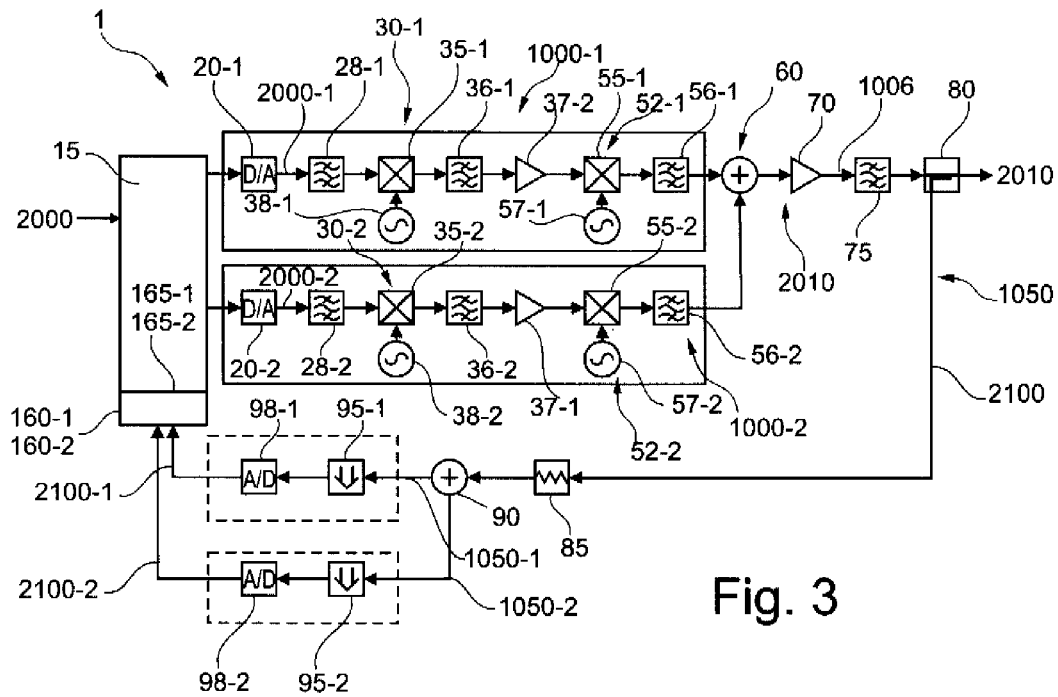
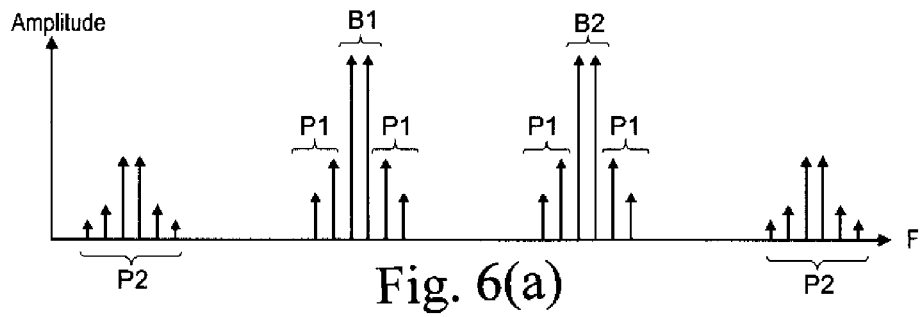
Fig. 6(a)
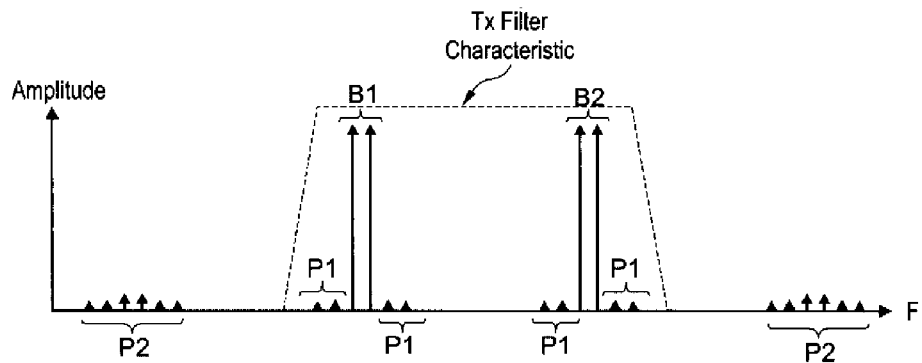
Fig. 6(b)

RADIO TRANSMITTER AND METHOD FOR TRANSMISSION OF COMBINED SIGNAL

CROSS-REFERENCE TO OTHER APPLICATIONS

This application is related to U.S. patent application Ser. No. 12/898,208 entitled: RADIO TRANSCEIVER AND METHOD FOR RECEPTION OF COMBINED RECEIVE SIGNALS, filed Oct. 5, 2010.

FIELD OF THE INVENTION

The field of the invention relates to a multi-band transmitter and a method for the transmission of a combined signal, in which the combined signal comprises signals from different frequency bands.

BACKGROUND OF THE INVENTION

The use of mobile communications networks has increased over the last decade. Operators of the mobile communications networks have increased the number of base stations in order to meet an increased demand for service by users of the mobile communications networks. The operators of the mobile communications network wish to reduce the running costs of the base station. One option to do this is to implement a radio system as an antenna-embedded radio forming an active antenna array. Many of the components of the antenna-embedded radio may be implemented on one or more chips.

Nowadays active antenna arrays are used in the field of mobile communications systems in order to reduce power transmitted to a handset of a customer and thereby increase the efficiency of the base station, i.e. the radio station. The radio station typically comprises a plurality of antenna elements, i.e. an antenna array adapted for transceiving a payload signal. Typically the radio station comprises a plurality of transmit paths and receive paths. Each of the transmit paths and receive paths are terminated by one of the antenna elements. The plurality of the antenna elements used in the radio station typically allows the steering of a beam transmitted by the antenna array. The steering of the beam includes but is not limited to at least one of: detection of direction of arrival (DOA), beam forming, down tilting and beam diversity. These techniques of beam steering are well-known in the art.

The code sharing and time division strategies as well as the beam steering rely on the radio station and the antenna array to transmit and receive within well defined limits set by communication standards. The communications standards typically provide a plurality of channels or frequency bands useable for an uplink communication from the handset to the radio station as well as for a downlink communication from the radio station to the handset. In order to comply with the communication standards it is of interest to reduce so called out of band emissions, i.e. transmission out of a communication frequency band or channel as defined by the communication standards.

For example, the communication standard "Global System for Mobile Communications (GSM)" for mobile communications uses different frequencies in different regions. In North America, GSM operates on the primary mobile communication bands 850 MHz and 1900 MHz. In Europe, Middle East and Asia most of the providers use 900 MHz and 1800 MHz bands.

Typically, a remote radio head or active antenna array is designed to transmit a single band. Digital dividend spectrum auctions and other releases of frequency spectrum have led to the desire from operators for multi-band products. Multi-band products save space on masts and hence save site rental and installation costs. The multi-band products may also enable two bands to be accommodated on heavily used masts where no space exists for additional antennas.

Multi-band transmitters for remote radio heads or active antenna arrays have been developed. FIG. 1 shows an example of such a conventional multi-band transmitter 1', in which a hybrid combiner is used for combining the outputs of two separate single-band transmitters.

The transmitter 1' as shown in FIG. 1 comprises two single-band transmitters 1A, 1B. The single-band transmitter 1A, 1B comprises a transmit path 1000-A, 1000-B between a digital signal processor 15 and a combiner 7. A payload signal S is processed by the digital signal processor 15, for example undergoing filtering, upconversion, crest factor reduction and beamforming processing, prior to forwarding to a digital-to-analogue conversion block 2-1, 2-2 adapted to convert the payload signal 2000 into an analogue payload signal SA, SB as a transmit signal.

The digital-to-analogue conversion block 2-1, 2-2 of FIG. 1 comprises delta-sigma digital-to-analogue converters. The analogue signal SA, SB is passed to a first filter 3-1, 3-2. Typically, the first filter 3-1, 3-2 comprises a band pass filter. The first filter 3-1, 3-2 allows the analogue payload signal SA, SB to pass the first filter 3-1, 3-2 in a group of frequency bands or channels as defined by the communication standard, such as 3GPP. The purpose of the first filter 3-1, 3-2 is to remove unwanted products from the digital to analogue conversion process, such as noise or spurious signals.

The first filter 3-1 in the transmit path 1000-A may pass the frequencies corresponding to a first transmit frequency band TB1. The first filter 3-2 in the transmit path 1000-B may pass the frequencies corresponding to a second transmit frequency band TB2. The first band TB1 may correspond to the frequency range according to an 800 MHz band Long Term Evolution LTE downlink (base-station transmit) communications frequency plan and the second band TB2 may correspond to the frequency range according to a GSM downlink—base-station transmit—communication frequency plan, e.g. 925-960 MHz.

The output of the first filter 3-1, 3-2 is passed to a radio frequency amplifier 4-1, 4-2 followed by a second filter 5-1, 5-2. The purpose of the second filter 5-1, 5-2 is to remove unwanted products from the amplification.

The outputs of the second filter 5-1, 5-2 on the transmit paths 1000-A, 1000-B are passed to a coupler 6-1, 6-2. The coupler 6-1, 6-2 is adapted to extract a portion of the transmit signal SA, SB as feedback signal SAF, SBF for correcting nonlinearities introduced by the amplifier 4-1, 4-2, as will be explained later.

The outputs of the coupler 6-1, 6-2 are the outputs of the single band transmitters 1A, 1B, which are combined in a broadband combiner 7. The broadband combiner 7 is adapted to combine the signal SA, SB on the two transmit paths 1000-1, 1000-2 into a combined signal SC. The broadband combiner 7 may be a conventional hybrid combiner or a Wilkinson combiner, as known in the art.

The amplifier 4-1, 4-2 typically introduces nonlinearities into the transmit path 1000-A, 1000-B. The nonlinearities introduced by the amplifier 4-1, 4-2 affect transfer characteristics of the transmit path. The nonlinearities introduced by the amplifier 4-1, 4-2 distort the payload signal relayed by the radio station as a transmit signal along the transmit paths.

The transfer characteristics of a device describe how the input signal(s) generate the output signal. It is known in the art that the transfer characteristics of a nonlinear device, for example a diode or an amplifier, are generally nonlinear.

The concept of predistortion uses the output signal of a device, for example from the amplifier, for correcting the nonlinear transfer characteristics of the device. The output signal of the device is compared to the input signal of the device by means of feedback and from this comparison correction coefficients are generated which are used to form or update an "inverse distortion" or predistortion signal. The predistortion signal is added and/or multiplied to the input signal in order to linearise the transfer characteristics of the device. The nonlinear transfer characteristics of the device can be corrected by carefully adjusting the predistortion.

To apply a correct amount of the predistortion signal to the amplifier it is of interest to know the distortions or nonlinearities introduced by the amplifier. This is commonly achieved by the feedback of the transmit signal to a predistorter. The predistorter is adapted to compare the transmitted signal (output signal) with a signal prior to amplification (input signal) in order to determine the distortions introduced by the amplifier. The input signal prior to amplification is, for example, the payload signal.

The concept of the predistortion has been explained in the above description in terms of correcting the transfer characteristics with respect to the amplitude of the transmit signal. It will be understood that predistortion may alternatively and/or additionally correct for nonlinearities with respect to a phase of the input signal and the output signal.

The nonlinearities of the transfer characteristics of the complete transmit path from a digital signal processor to the antenna element are typically dominated by the nonlinearities in the transfer characteristics of the amplifier. It is therefore often sufficient to correct for the nonlinearities of the amplifier.

Referring to FIG. 1, the feedback signal SAF, SBF is extracted in order to correct the nonlinearities of the amplifier 4-1, 4-2. The feedback signal 2AF, 2BF is passed on a feedback path 1000-AF, 1000-BF leading to a digital predistortion unit 11, as is known in the art.

The feedback path 1000-AF, 1000-BF comprises an attenuator 8-1, 8-2, a filtering and down conversion block 9-1, 9-2, followed by an analogue-to-digital converter 10-1, 10-2. The digitized feedback signals 2AF, 2BF are used by the digital predistortion unit 11 to extract the nonlinearities introduced by the amplifier 4-1, 4-2 and correct the transmit signal.

As will be readily apparent to the man skilled in the art, the conventional dual band transmitter 1' comprises combining the outputs of two separate single-band transmitters 1A, 1B, using a broadband coupler such as a Wilkinson or 3 dB hybrid coupler 7. The combiner 7 however introduces a minimum of 3 dB of loss into each of the RF output paths and therefore wastes valuable RF output power. The conventional dual band transmitter 1' is however flexible and can be used to combine almost any radio frequency bands to feed a single antenna or antenna element.

FIG. 2 shows another conventional multi-band transmitter 1", which utilises a filter-based combiner 7A, 7B. The multi band transmitter of FIG. 2 differs from FIG. 1 in that the broadband combiner 7 is replaced by two duplexers 7A, 7B for combining the outputs of the two separate single-band transmitters 1A', 1B'. Those elements of FIG. 2 which are identical to the elements of FIG. 1 have identical reference numerals.

The dual band transmitter 1" of FIG. 2 advantageously reduces the loss compared to the dual-band transmitter 1' of FIG. 1, because the duplexers 7A, 7B induce less loss than the broadband combiner 7. However, the multi-band transmitter 1" of FIG. 2 is also less flexible than the multi-band transmitter 1' of FIG. 1 based on the hybrid combiner approach. The two duplexers must indeed be designed specifically for each pair or multiplicity of bands to be combined.

SUMMARY OF THE INVENTION

The present disclosure discloses a radio transmitter comprising at least two transmit paths; and a combiner connected to the at least two transmit paths for combining modified transmit signals on the at least two transmit paths to form a combined signal. A power amplifier is provided for receiving and power amplifying the combined signal resulting in an amplified combined signal. The radio transmitter further comprises at least one feedback path for sampling the amplified combined signal and at least two predistortion elements connected to the at least one feedback path and adapted to produce at least two individual predistortion functions for modification of the transmit signals in the at least two frequency bands to produce the modified transmit signals on the at least two transmit paths, resulting in a corrected amplified combined signal.

In one aspect of the disclosure, one of the at least two predistortion elements is adapted to produce an individual predistortion function for modification of one of the transmit signals in one of the at least two frequency bands, and another one of the at least two predistortion elements is adapted to produce another individual predistortion function for modification of another one of the transmit signals in another one of the at least two frequency bands.

In yet another aspect of the disclosure, the radio transmitter comprises a filter element adapted for filtering the amplified combined signal, to filter out intermodulation products generated by inter band intermodulation.

The predistortion functions may be one of a digital predistortion function or of an analogue predistortion function.

In a further aspect of the disclosure, the radio transmitter comprises at least two filtering and analogue-to-digital conversion blocks, one of the at least two filtering and analogue-to-digital conversion blocks being on one individual feedback path for processing an individual one of the at least two frequency bands, and another one of the at least two filtering and analogue-to-digital conversion blocks being on another feedback path for processing of another individual one of the at least two frequency bands.

The disclosure also teaches a method for the transmission of a combined signal, wherein the combined signal comprises signals from different frequency bands. The method comprises generating individual predistortion functions for each of the different frequency bands; applying the individual predistortion functions to transmit signals from the different frequency bands to form modified transmit signals. The method comprises combining the modified transmit signals to form a combined modified transmit signal; amplifying the combined modified transmit signal resulting in an amplified combined signal; and sampling the amplified combined signal for enabling the generation of the individual predistortion functions.

In one aspect of the disclosure, the method for the transmission of a combined signal comprises producing, by one of the at least two predistortion elements, an individual predistortion function for modification of one of the transmit signals in one of the at least two frequency bands, and producing, by another one of the at least two predistortion elements, another individual predistortion function for modification of another one of the transmit signals in another one of the at least two frequency bands.

In another aspect of the disclosure, the method for the transmission of a combined signal comprises filtering the amplified combined signal by a single filter element, to filter out intermodulation products generated by inter band intermodulation.

The present disclosure also teaches a computer program product comprising a non-transitory computer-usable medium having control logic stored therein for causing a computer to manufacture a radio transmitter for a mobile communications network, the radio transmitter comprising: at least two transmit paths; a combiner connected to the at least two transmit paths for combining modified transmit signals on the at least two transmit paths to form a combined signal; a power amplifier for receiving and power amplifying the combined signal resulting in an amplified combined signal; at least one feedback path for sampling the amplified combined signal; at least two predistortion elements connected to the at least one feedback path and adapted to produce at least two individual predistortion functions for modification of the transmit signals in the at least two frequency bands to produce the modified transmit signals on the at least two transmit paths, resulting in a corrected amplified combined signal.

The present disclosure further teaches a computer program product comprising a non-transitory computer-usable medium having control logic stored therein for causing a radio transmitter to execute a method for the transmission of a combined signal, wherein the combined signal comprises signals from different frequency bands, comprising first computer readable code means for generating individual predistortion functions for each of the different frequency bands; second computer readable code means for applying the individual predistortion functions to transmit signals from the different frequency bands to form modified transmit signals; third computer readable code means for combining the modified transmit signals to form a combined modified transmit signal; fourth computer readable code means for amplifying the combined modified transmit signal resulting in an amplified combined signal; fifth computer readable code means for sampling the amplified combined signal for enabling the generation of the individual predistortion functions.

DESCRIPTION OF THE FIGS

FIG. 3 shows a first aspect of a multiband transmitter according to the present disclosure.

Figure 7:
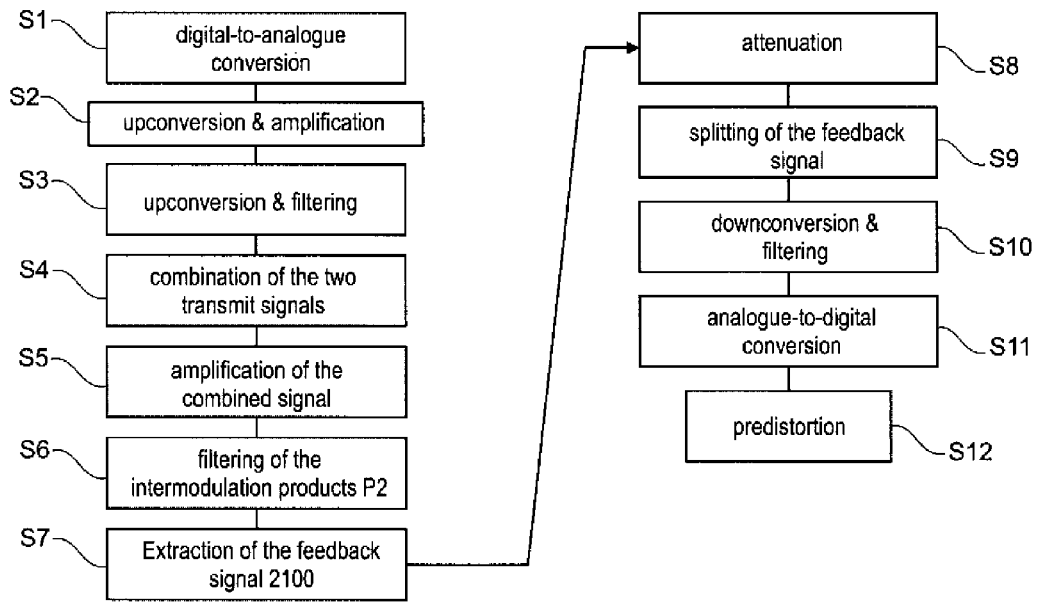

FIGS. 6(a)&(b) show different components of a spectrum and the linearization of the spectrum with a multiband transceiver according to the present disclosure FIG. 7 shows a method for the transmission of a combined signal according to the present disclosure.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature or features of a different aspect or aspects and/or embodiments of the invention.

The transmitter 1 as shown in FIG. 3 comprises at least two transmit paths 1000-1, 1000-2. There are two different transmit paths 1000-1, 1000-2 displayed within FIG. 3. It will however be appreciated by the person skilled in the art that the number of transmit paths 1000-1, 1000-2 can be changed. In a typical implementation there will be thirty two transmit paths (for a dual-band, 16-element active antenna system), but this is not limiting of the invention. FIG. 3 shows only a dual-band implementation for a single antenna element. Each one of the transmit paths 1000-1, 1000-2 is terminated by a duplex filter and an antenna element (not shown on the figures).

In a transmit path 1000-1, 1000-2, the payload signal 2000 is processed by the digital signal processor 15, for example undergoing filtering, upconversion, crest factor reduction and beamforming processing, prior to forwarding to a digital-to-analogue conversion block 20-1, 20-2 adapted to convert the payload signal 2000 into an analogue payload signal 2000-1, 2000-2 as a transmit signal. The analogue payload signal 2000-1, 2000-2 may be provided as pairs of amplitude and phase values (A, P). The payload signal 2000 is not changed by the selected form of the payload signal 2000 i.e. (I, Q) or pairs of phase and amplitude (A, P).

The digital-to-analogue conversion block 20-1, 20-2 comprises conventional digital-to-analogue converters 20-1, 20-2. Alternately, the digital-to-analogue conversion block 20-1, 20-2 may be in the form of delta-sigma digital-to-analogue converters.

The analogue signal 2000-1, 2000-2 is passed to a first filter 28-1, 28-2. The first filter 28-1, 28-2 may be any filter adapted to appropriately filter the analogue payload signal 2000-1, 2000-2 leaving the digital-to-analogue conversion block 20-1, 20-2 after conversion of the payload signal 2000 into an analogue form. Typically, the first filter 28-1, 28-2 comprises a band pass filter. The first filter 28-1, 28-2 allows the analogue payload signal 2000-1, 2000-2 to pass the first filter 28-1, 28-2 in a group of frequency bands or channels as defined by the communication standard, such as 3GPP. The purpose of the first filter 28-1, 28-2 is to remove unwanted products from the digital to analogue conversion process, such as noise or spurious signals.

The first filter 28-1 in the transmit path 1000-1 may pass the frequencies corresponding to a first band IFB1 in the intermediate frequency range. The first filter 28-2 in the transmit path 1000-2 may pass the frequencies corresponding to a second band IFB2 in the intermediate frequency range. The intermediate frequency band may be chosen depending on many factors, such as, but not limited to, the required channels and predistortion correction frequencies.

The output of the first filter 28-1, 28-2 is passed to an up-conversion block 30-1, 30-2. The up-conversion block 30-1, 30-2 is adapted for up-converting the analogue payload signal 2000-1, 2000-2. The up-conversion block 30-1, 30-2 comprises an up-mixer 35-1, 35-2 along with a filter 36-1, 36-2. The up-mixers 35-1, 35-2 are known in the art and will not be discussed further within this disclosure. The up-conversion block 30-1, 30-2 comprises a local oscillator input port and this input port receives a local oscillator signal from a local oscillator 38-1, 38-2.

In the aspect of the invention shown in FIG. 3, the up-conversion block 30-1, 30-2 is adapted to convert the analogue payload signal 2000-1, 2000-2 into an intermediate frequency payload signal.

In FIG. 3, the output of the filter 36-1, 36-2 is passed into a first amplifier 37-1, 37-2. The first amplifier 37-1 on the transmit path 1000-1 is adapted to work at the intermediate frequencies of the first frequency band IFB1. The first amplifier 37-2 on the transmit path 1000-2 is adapted to work at the intermediate frequencies of the first frequency band IFB2.

In FIG. 3, the output of the first amplifier 37-1, 37-2 is passed to a second up-conversion block 52-1, 52-2. The second up-conversion block 52-1, 52-2 is adapted to convert the signal 2000-1, 2000-2 from the intermediate frequency range IFB1, IFB2 to a radio frequency range B1, B2. Each one of the up-conversion blocks 52-1, 52-2 comprises an up-mixer 55-1, 55-2 along with a filter 56-1, 56-2. The up-mixers 55-1, 55-2 are known in the art and will not be discussed further within this disclosure. The up-conversion block 52-1, 52-2 receives a local oscillator signal from a local oscillator 57-1, 57-2.

The two signals 2000-1, 2000-2 outputted from the two third filters 56-1, 56-2 on the transmit paths 1000-1, 1000-2 are passed to a single combiner 60. The combiner 60 is adapted to combine the signals 2000-1, 2000-2 on the two transmit paths 1000-1, 1000-2 into a combined signal 2010. The combiner 60 may be a conventional hybrid combiner or a Wilkinson combiner. Combiners are well-known in the art and will not be explained further in the disclosure.

The combined signal 2010 is passed on a common transmit path 1006. The common transmit path 1006 comprises an amplifier 70 for power amplifying the combined signal 2010, resulting in an amplified combined signal 2020. The power amplifier 70 is a wideband amplifier covering at least two frequency bands. The power amplifier 70 is adapted to work in the radio frequency range. A suitable wideband amplifier 70 could be a gallium nitride (GaN) based RF power amplifier, but this is not limiting of the invention.

The man skilled in the art would recognise that different amplifiers 37-1-, 37-2 and 70 are provided within the dual-band transmitter 1. Each one of the amplifiers 37-1-, 37-2 and 70 introduces nonlinearities, which affect transfer characteristics of the transmit path. The nonlinearities introduced by the amplifiers distort the payload signal relayed by the radio station as a transmit signal along the transmit paths, as explained above in reference to the conventional dual band transmitter The amplifiers 37-1, 37-2 on the individual transmit paths 1000-1, 1000-2 are single-band amplifiers, with the amplifier 37-1 amplifying a first frequency band IFB1 in the intermediate frequency range and the amplifier 37-2 amplifying a second frequency band IFB2 in the intermediate frequency. The amplifier nonlinearities act upon the signals present within the first and second frequency bands IFB1, IFB2. The resulting intermodulation products can be found within each frequency band IFB1, IFB2 and closely surrounding each frequency band IFB1, IFB2. The intermodulation products resulting form the nonlinearities of the amplifier 37-1, 37-2 may be referred to as "intra-band intermodulation products".

The amplifier 70 on the combined transmit path 1006 is a wideband amplifier. The amplifier 70 is adapted for amplifying two transmit bands of frequency B1, B2 in the radio frequency range. The amplification of two distinct frequency bands B1 and B2 by the single amplifier 70 generates two sets of inter modulation products, as illustrated in FIG. 6a.

The first set of intermodulation products P1 results from the power amplifier non-linearities acting upon the signals present within the frequency bands B1 and B2. The first set of inter-modulation products can be found within each frequency band B1, B2 and closely surrounding each frequency band B1, B2. The first set of inter-modulation products P1 is referred to as "intra-band inter-modulation products".

The second set of inter-modulation products P2 results from the mixing of the signals present within the two frequency bands B1, B2. The second set of inter-modulation products is referred to as "inter-band inter-modulation products". The second set of inter-modulation products can be found spaced from the frequency bands B1, B2 by multiples of frequency separation between the frequency bands B1 and B2.

Referring to FIG. 3, the amplified combined signal 2010 is passed to a second filter 75. The filter 75 is adapted to remove inter-band inter modulation products P2. The filter 75 may be any filter adapted to appropriately filter the amplified combined signal 2020 leaving the amplifier 70. Typically, the second filter 75 comprises a dual-band band-pass filter, with a single pass band, to pass the frequencies of the first and second bands B1, B2 and to remove out of band signals, as illustrated by the dotted line in FIG. 6b.

The output of the second filter 75 is passed to a coupler 80. The coupler 80 is adapted to extract a portion of the combined signal 2010 out of the common transmit path 1006 as a feedback signal 2100. As explained above, the feedback signal 2100 is used for the predistortion of the signal 2000-1, 2000-2.

The coupler 80 is known in the art and may, for example, comprise a circulator or a directional coupler. Obviously any other form of coupler 80 is appropriate for use with the present disclosure, provided the coupler 80 allows the extraction of a feedback signal 2100 out of the combined signal 2010.

The feedback signal 2100 is passed to a feedback path 1050 comprising an attenuator 85 and a splitter 90. The attenuator 85 serves to reduce a power level of the feedback signal 2100. It should be noted that the attenuator 85 should be of a substantially linear transfer characteristic over the frequency and power range of the two transmit paths. The linear transfer characteristics of the attenuator 85 prevent further non-linearities being introduced to the feedback signals 2100 emanating from the attenuator 85.

The splitter 90 is adapted to separate the feedback signals 2100 into two individual feedback signals 2100-1, 2100-2 onto two feedback paths 1050-1, 1050-2. Each of the feedback signals 2100-1, 2100-2 on the feedback paths 1050-1, 1050-2 is used to modify the respective analogue payload signal 2000-1, 2000-2 on the transmit paths 1000-1, 1000-2.

The feedback signal 2100-1, 2100-2 is fed into a feedback path 1050-1, 1050-2 leading from the splitter 90 to a predistortion element 160-1, 160-2 to produce two predistortion functions 165-1, 165-2 for modification of the transmit signals 2000-1, 2000-2.

Individual feedback paths 1050-1, 1050-2 are contemplated for each one of the transmit paths 1005-1, 1005-2. Each feedback signal 2100-1, 2100-2 is a representation of the non-linearities accumulated along an individual one of the transmit paths 1005-1, 1005-2 as well as along the common transmit path 1006.

Each of the feedback paths 1050-1, 1050-2 comprises a down-converting and filtering block 95-1, 95-2 followed by a analogue to digital conversion block 98-1, 98-2. The down-converting and filtering block 95-1, 95-2 comprises a band pass filter (although a low-pass filter could be used in some circumstances). The first down-converting and filtering block 95-1 is adapted to pass the frequencies of the first frequency band B1, and the second down-converting and filtering block 95-2 is adapted to pass the frequencies of the second frequency band B2.

The analogue to digital conversion block 98-1, 98-2 comprises conventional analogue to digital converters 98-1, 98-2.

The analogue to digital conversion block 98-1 and the analogue to digital conversion block 98-2 may be replaced by delta-sigma analogue to digital converters, as will be described with reference to FIG. 4.

The predistortion element 160-1, 160-2 uses the feedback signal 2100-1, 2100-2 to determine the distortions introduced by the amplifiers 37-1, 37-2 and 70, in particular the intra-band inter-modulation products P1. To correct the non-linearities, the predistortion element 160-1, 160-2 is also adapted to predistort the payload signal 2000 such that the non-linearities introduced by the amplifiers 37-1, 37-2 and 70 are corrected and consequently the non-linearity signal intra-band inter-modulation products, P1, are substantially reduced.

The predistortion element 160-1, 160-2 may comprise a distortion detection unit configured to detect a level of residual distortion in the feedback signal 2100-1, 2100-2. The output of the distortion detection unit may be passed to a coefficient calculation unit for processing. The predistortion coefficient calculation unit is adapted to update the predistortions imposed onto the analogue payload signal 2000-1, 2000-2.

Different methods can be used such as look-up tables or polynomial coefficients. These methods are known in the art and will not be described further in the disclosure.

As should be clear from the man skilled in the art, the transmitter of FIG. 3 allows for a combination of two signals comprising signals of different frequency bands, at low power, prior to the amplification of the combined signal by the amplifier 70. The inherent insertion loss of the combiner 60 is therefore immediately compensated during amplification. Furthermore, the substantial losses in the combiner 60 (50% or more, typically) occur at a low power level and therefore have a negligible effect upon the overall power efficiency of the transmit paths 1000-1 and 1000-2.

The common wide band amplifier 70 generates both the inter-band inter modulation products P2, which are wide band and remote from the frequency bands B1, B2, and the intra-band inter-modulation products P1, located within or closely surrounding the bands B1, B2.

Instead of removing the intra-band and inter-band modulation products P1, P2 by linearising the signal across the entire spectrum, including the frequency bands B1, B2 and the inter-modulation products P1, P2, as known in the art, the present transmitter 1 advantageously uses two different methods for removing the nonlinearities introduced by the amplifier 70, as illustrated in FIG. 6*b*.

The inter-band inter-modulation products P2 are removed from the combined transmit signal 2010 with the filter 75, before the extraction of the feedback signals 2100-1, 2100-2 The filter 75 is a conventional band-pass transmit filter passing the frequencies in the range of the two frequency bands B1, B2. It may, for example, form part of the duplex filtering typically used in a transceiver.

The intra-band inter-modulation products P1 are removed by using a feedback path and a predistortion element for each one of the frequency bands B1, B2, individually for each frequency band B1, B2. Each one of the frequency bands B1, B2 is therefore treated independently of the other one of the frequency bands B1, B2 for the purposes of calculating the coefficients and hence the transfer characteristic of the pre-distortion subsystem.

The use of separate digital predistortion elements 160-1, 160-2 for each frequency band B1, B2 allows the predistortion performance to be optimised where it is most needed—it is very likely that different DPD characteristics will be required for the different frequency bands B1 and B2, since the power amplifier's non-linearity is likely to change sufficiently such that a single DPD characteristic would be an unacceptable compromise.

Figure 1:
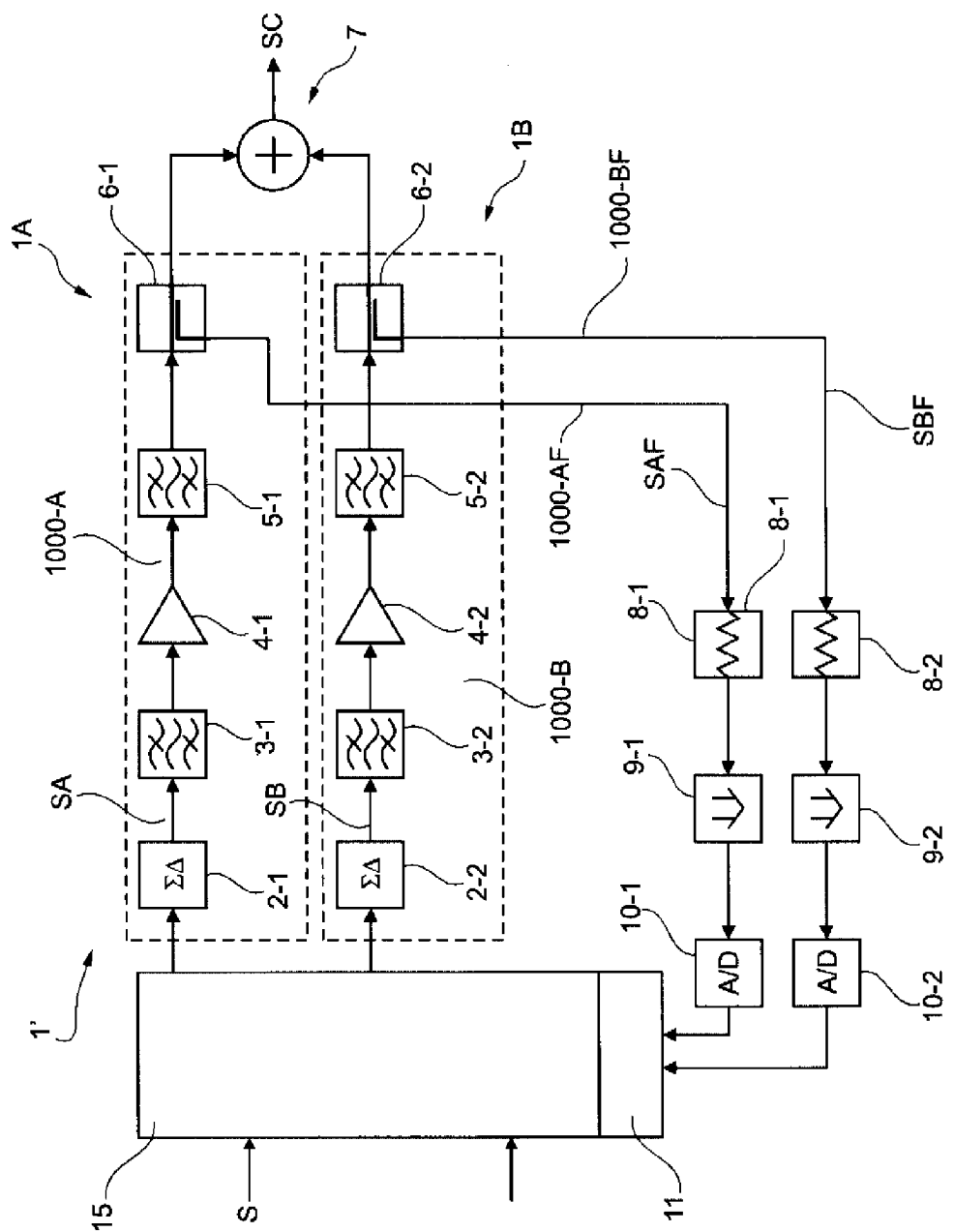
FIG. 1 shows a multiband transmitter according to the prior art.
Figure 2:
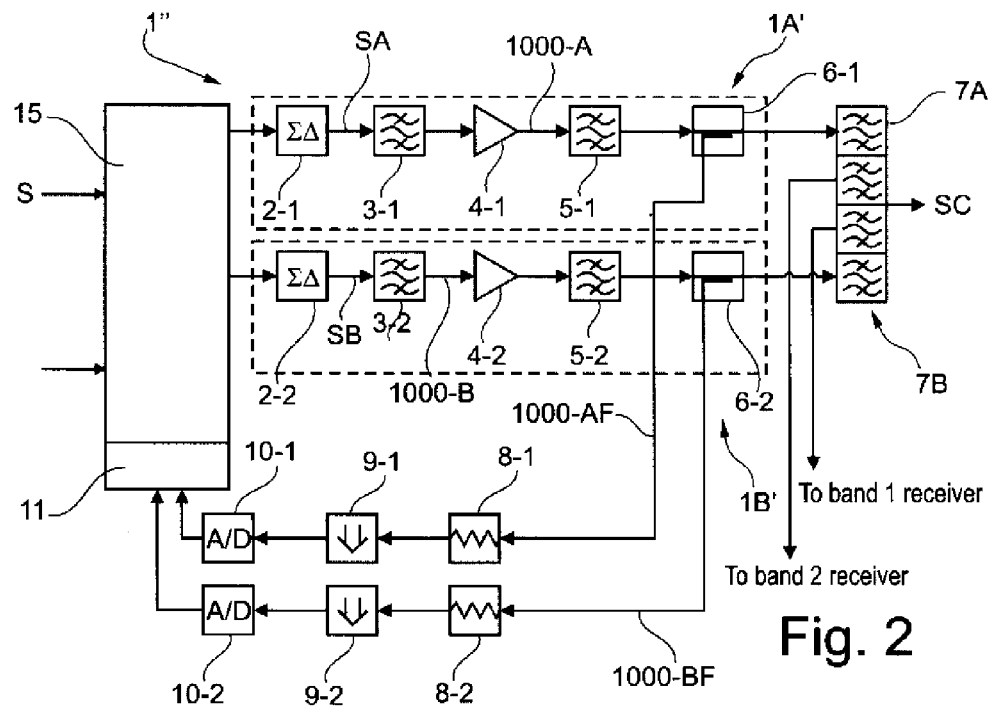
FIG. 2 shows another multiband transmitter according to the prior art
Figure 4:
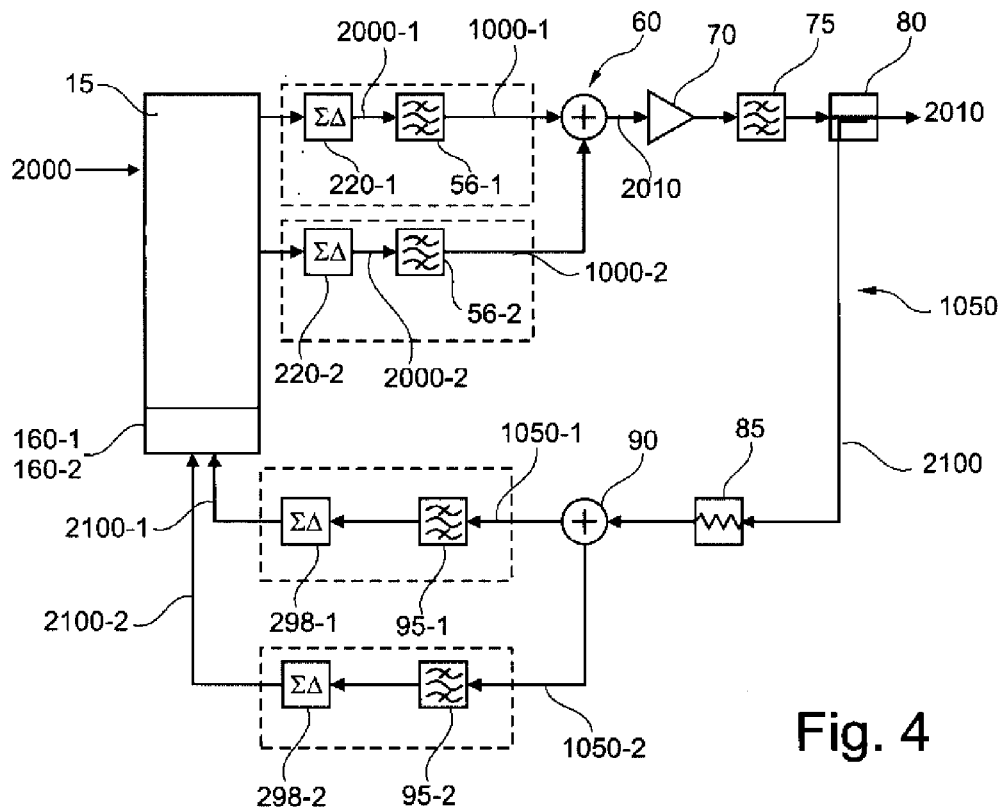
FIG. 4 shows a further aspect of a multiband transmitter according to the present disclosure.

FIG. 4 shows an alternative aspect of the transmitter. Those elements of FIG. 4 which are identical to the elements of FIG. 3 have identical reference numerals. The alternative aspect of the transmitter of FIG. 4 differs from the transmitter 1 of FIG. 3 in that the digital-to-analogue converters 20-1, 20-2, first filters 28-1, 28-2, up-converters 30-1, 30-2, IF amplifiers 37-1, 37-2, and up converters 55-1, 55-2 are replaced by delta-sigma digital-to-analogue converters 220-1, 220-2. The delta-sigma digital-to-analogue converters 220-1, 220-2 remove the need for an up mixer 35-1, 35-2, and 571, 57-2 in the transmit path 1000-1, 1000-2, as is needed with the digital-to-analogue converters 20-1, 20-2 of FIG. 1. It will be apparent that the use of the delta-sigma digital-to-analogue converters 220-1, 220-2 is of interest in order to reduce the system complexity of the radio station 1, as the up mixers are no longer needed.

The alternative aspect of the transmitter of FIG. 4 further differs from the transmitter of FIG. 3 in that the down-converting and filtering block 95-1, 95-2 followed by the analogue to digital conversion blocks 98-1, 98-2 are replaced by delta-sigma analogue to digital converters 298-1, 298-2. The delta-sigma analogue to digital converters 298-1, 298-2 remove the need for down mixers in the feedback path, as is needed with the analogue to digital converters 95-1, 95-2 of FIG. 1.

It will be apparent that any combination of conventional analogue to digital converting blocks, conventional digital to analogue converting blocks, and of delta-sigma digital-to-analogue converters or delta-sigma analogue to digital converters may be contemplated. Digital-to-analogue converters and quadrature upconverters can also be used. Digital-to-analogue converters and quadrature upconverters can take a number of forms; these are known in the art. Likewise, analogue-to digital converters and quadrature downconverters can be used in the feedback path. The analogue-to digital converters and the quadrature downconverters can take a number of forms; again, these are known in the art.

It will be understood that it is not necessary for the digital-to-analogue block and analogue-to-digital converters for the two frequency bands B1, B2 to be identical or substantially similar. For example if the first frequency band B1 is intended, at least partially, for GSM transmission and the other frequency band B2 is intended for UMTS or LTE transmission only, then it may be advantageous to use a digital-to-analogue block and analogue-to-digital converters of differing specifications for each one of the different frequency bands B1, B2 (e.g. higher specification converters for the GSM band and lower specification ones for the UMTS or LTE bands).

It is noted that two feedback paths 1050-1, 1050-2 are shown on FIGS. 3 and 4. Alternately a single feedback path could be used, and the predistortion process could be located in the DSP 15 only, as long as each frequency band B1, B2 is predistorted individually. In this case, the filtering required to separate the two bands B1, B2 would be performed in the DSP 15, prior to these two bands B1 and B2 being fed to their respective DPD calculation and processing blocks.

Figure 5:
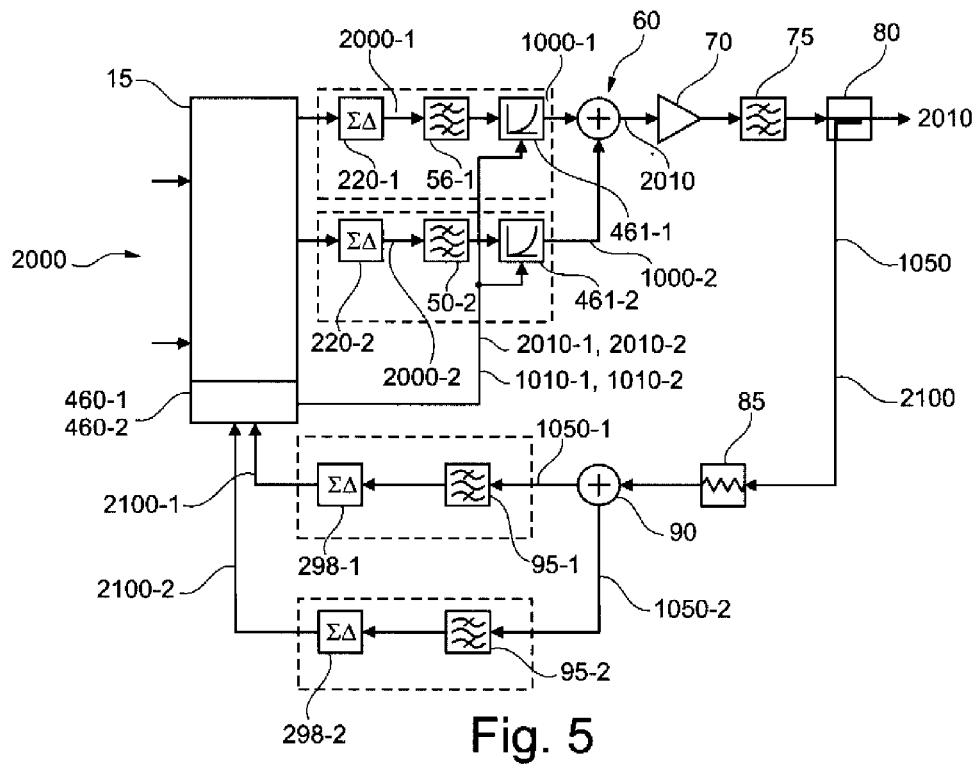
FIG. 5 shows a further aspect of a multiband transmitter according to the present disclosure.

FIG. 5 shows an alternative aspect of the transmitter. The alternative aspect of the transmitter of FIG. 5 differs from the transmitter 1 of FIG. 4 in that the predistortion process is an analogue predistortion process. Those elements of FIG. 5 which are identical to the elements of FIG. 4 have identical reference numerals. The digital predistortion elements 160-1, 160-2 located within the digital signal processing 15 of FIG.

4 are replaced by a predistortion update element 460-1, 460-2 connected to a predistorter 461-1, 461-2.

The predistortion update element 460-1, 460-2 is adapted to update the predistortion coefficients or look-up table values and to generate a correction signal 2010-1, 2010-2. The predistortion update element 460-1, 460-2 may be implemented using the DSP 15.

The correction signal 2010-1, 2010-2 is forwarded on a correction signal path 1010-1, 1010-2. The correction signal 2010-1, 2010-2 is passed to the predistorter 461-1, 461-2 on the transmit paths 1000-1, 1000-2 for the predistortion of the transmit signal 2000-1, 2000-2.

FIG. 7 shows an overview of the method according to one aspect of this disclosure for the transmission of a combined signal. The combined signal comprises signals from the different frequency bands and can be used in conjunction with the transmitter of FIG. 3.

In step S1, the payload signal 2000 is converted to the analogue payload signal 2000-1, 2000-2. The analogue payload signal 2000-1, 2000-2 is forwarded along the transmission path 1005-1, 1005-2. The analogue payload signal 2000-1, 2000-2 is upconverted into intermediate frequencies and amplified by IF amplifier 37-1, 37-2 (step S2)

The IF payload signal 2000-1, 2000-2 is up converted to RF frequencies in the second up-conversion block 52-1, 52-2. The filtering may comprise the use of the band pass filter 56-1, 56-2. The band pass filter 56-1, 56-2 may comprise a filtering characteristic as defined by the communication protocol (step S3).

The method outlined in FIG. 7 is described with two up-conversion stages as shown in FIG. 3. It will be appreciated that this is not limiting and that the method could comprise a single up-conversion stages as required (and as known from FIGS. 4 and 5).

A combination step S4 comprises the combination of the two analogue transmit signals 2000-1, 2000-2, by the combiner 60. The output of the combiner 60 is a combined signal 2010, passed onto a combined signal path 1006.

The combined signal 2010 is thereafter amplified by the wide band amplifier 70, at step S5. The inter-band modulation products P2 are removed by the filter 75 at step S6.

An extraction step S7 comprises the extraction of a feedback signal out of the common transmission path 1006. The extraction step S7 is implemented by the coupler 80.

At step S8 the feedback signal 2100 is passed to an attenuator 85 on a common feedback path 1050, in order to reduce the level of power of the feedback signal 2100.

The feedback signal 2100 is thereafter split into two feedback signals 2100-1, 2100-2 on two individual feedback paths 1050-1, 1050-2, by the splitter 90 (step S9).

The feedback signals 2100-1, 2100-2 are passed to the downconverting and filtering unit 92-1, 92-2 at step S10. The first downconverting and filtering unit 95-1 is adapted to filter the frequency of the feedback signals 2100-1, corresponding to the first frequency band B1, and to filter the out-of band signals. The second downconverting and filtering unit 95-2 is adapted to filter the frequency of the feedback signals 2100-2, corresponding to the second frequency band B2, and thereby to remove the out-of band signals.

The output of the tuning and filtering unit 92-1, 92-2 is digitized at step S11 and sent to the predistortion elements 160-1, 160-2 for the individual predistortion of the transmit signals 2000-1, 2000-2 (step S12).

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a central processing unit ("CPU"), micro processor, micro controller, digital signal processor, processor core, system on chip ("SOC") or any other device), implementations may also be embodied in software (e.g. computer readable code, program code, and/or instructions disposed in any form, such as source, object or machine language) disposed for example in a non-transistory computer useable (e.g. readable) medium configured to store the software. Such software can enable, for example, the function, fabrication, modelling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known non-transitory computer useable medium such as semiconductor, magnetic disc, or optical disc (e.g., CD-ROM, DVD-ROM, etc.). The software can also be disposed as a computer data signal embodied in a non-transitory computer useable (e.g. readable) transmission medium (e.g., carrier wave or any other medium including digital, optical, analogue-based medium). Embodiments of the present invention may include methods of providing the apparatus described herein by providing software describing the apparatus and subsequently transmitting the software as a computer data signal over a communication network including the internet and intranets.

It is understood that the apparatus and method describe herein may be included in a semiconductor intellectual property core, such as a micro processor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A radio transmitter comprising:
   at least two transmit paths;
   a common baseband digital input signal applied to the least two transmit paths;
   a combiner connected to the at least two transmit paths for combining modified transmit signals on the at least two transmit paths to form a combined signal;
   a power amplifier for receiving and power amplifying the combined signal resulting in an amplified combined signal;
   at least one feedback path for sampling the amplified combined signal;
   at least two baseband digital predistortion elements connected to the at least one feedback path and adapted to produce at least two individual baseband digital predistortion functions for modification of the transmit signals in the at least two frequency bands to produce the modified transmit signals on the at least two transmit paths, resulting in a corrected amplified combined signal.

2. The radio transmitter according to claim 1, wherein one of the at least two predistortion elements is adapted to produce an individual predistortion function for modification of one of the transmit signals in one of the at least two frequency bands, and another one of the at least two predistortion elements is adapted to produce another individual predistortion function for modification of another one of the transmit signals in another one of the at least two frequency bands.

3. The radio transmitter according to claim 1, comprising a filter element adapted for filtering the amplified combined signal to filter out intermodulation products generated by inter band intermodulation.

4. The radio transmitter according to claim 1, comprising at least two filtering and analogue-to-digital conversion blocks, one of the at least two filtering and analogue-to-digital conversion blocks being on one individual feedback path for processing an individual one of the at least two frequency bands, and another one of the at least two filtering and analogue-to-digital conversion blocks being on another feedback path for processing of another individual one of the at least two frequency bands.

5. A method for the transmission of a combined signal, wherein the combined signal comprises signals from different frequency bands, comprising:
   generating, by a predistortion element, individual baseband digital predistortion functions for each of the different frequency bands;
   applying, by the individual baseband digital predistortion elements, predistortion functions to transmit signals from the different frequency bands to form modified transmit signals;
   combining, by a combiner, the modified transmit signals to form a combined modified transmit signal;
   amplifying, by a common wide band amplifier, the combined modified transmit signal resulting in an amplified combined signal;
   sampling, by a coupler, the amplified combined signal for enabling the generation of the individual baseband digital predistortion functions.

6. The method for the transmission of a combined signal according to claim 5, comprising
   producing, by one of the at least two predistortion elements, an individual predistortion function for modification of one of the transmit signals in one of the at least two frequency bands, and
   producing, by another one of the at least two predistortion elements, another individual predistortion function for modification of another one of the transmit signals in another one of the at least two frequency bands.

7. The method for the transmission of a combined signal according to claim 5, comprising filtering the amplified combined signal by a single filter element to filter out intermodulation products generated by inter band intermodulation.

8. A computer program product comprising a non-transitory computer-usable medium having control logic stored therein for causing a computer to manufacture a radio transmitter for a mobile communications network, the radio transmitter comprising:
   at least two transmit paths;
   a common baseband digital input signal applied to the at least two transmit paths;
   a combiner connected to the at least two transmit paths for combining modified transmit signals on the at least two transmit paths to form a combined signal;
   a power amplifier for receiving and power amplifying the combined signal resulting in an amplified combined signal;
   at least one feedback path for sampling the amplified combined signal;
   at least two baseband digital predistortion elements connected to the at least one feedback path and adapted to produce at least two individual baseband digital predistortion functions for modification of the transmit signals in the at least two frequency bands to produce the modified transmit signals on the at least two transmit paths, resulting in a corrected amplified combined signal.

9. A computer program product comprising a non-transitory computer-usable medium having control logic stored therein for causing a radio transmitter to execute a method for the transmission of a combined signal, wherein the combined signal comprises signals from different frequency bands, comprising
   first computer readable code means for generating individual baseband digital predistortion functions for each of the different frequency bands
   second computer readable code means for applying the individual baseband digital predistortion functions to transmit signals from the different frequency bands to form modified transmit signals
   third computer readable code means for combining the modified transmit signals to form a combined modified transmit signal
   fourth computer readable code means for amplifying the combined modified transmit signal resulting in an amplified combined signal
   fifth computer readable code means for sampling the amplified combined signal for enabling the generation of the individual digital baseband predistortion functions.

* * * * *

UNITED STATES PATENT AND TRADEMARK OFFICE
CERTIFICATE OF CORRECTION

PATENT NO.         : 8,355,682 B2                                    Page 1 of 1
APPLICATION NO.    : 12/898021
DATED              : January 15, 2013
INVENTOR(S)        : Peter Kenington It is certified that error appears in the above-identified patent and that said Letters Patent is hereby corrected as shown below:

Column 1, line 11, insert -- The entire contents of the foregoing application are incorporated herein by reference. --

Column 12, Claim 1, line 43, "applied to the least";
        should read -- applied to the at least --

Signed and Sealed this
Twenty-sixth Day of February, 2013

Teresa Stanek Rea
*Acting Director of the United States Patent and Trademark Office*